United States Patent
Nishio et al.

(10) Patent No.: US 10,475,943 B2
(45) Date of Patent: Nov. 12, 2019

(54) WHITE POLYESTER FILM FOR A SOLAR CELL, SEALING SHEET FOR BACK SURFACE OF SOLAR CELL USING SAME, AND SOLAR CELL MODULE

(71) Applicant: TOYOBO CO., LTD., Osaka-shi, Osaka (JP)

(72) Inventors: Shotaro Nishio, Tsuruga (JP); Akira Shimizu, Tsuruga (JP); Jun Inagaki, Otsu (JP); Shinji Sawasaki, Osaka (JP)

(73) Assignee: TOYOBO CO., LTD., Osaka (JP)

( * ) Notice: Subject to any disclaimer, the term of this patent is extended or adjusted under 35 U.S.C. 154(b) by 83 days.

(21) Appl. No.: 15/558,555

(22) PCT Filed: Mar. 15, 2016

(86) PCT No.: PCT/JP2016/058090
§ 371 (c)(1),
(2) Date: Sep. 14, 2017

(87) PCT Pub. No.: WO2016/152638
PCT Pub. Date: Sep. 29, 2016

(65) Prior Publication Data
US 2018/0062013 A1 Mar. 1, 2018

(30) Foreign Application Priority Data
Mar. 20, 2015 (JP) .................. 2015-057684

(51) Int. Cl.
*H01L 31/048* (2014.01)
*B32B 27/18* (2006.01)
(Continued)

(52) U.S. Cl.
CPC ............ *H01L 31/0481* (2013.01); *B32B 7/12* (2013.01); *B32B 27/08* (2013.01); *B32B 27/18* (2013.01); *B32B 27/20* (2013.01); *B32B 27/304* (2013.01); *B32B 27/306* (2013.01); *B32B 27/36* (2013.01); *H01L 31/049* (2014.12); *H01L 31/0547* (2014.12); *B32B 2250/02* (2013.01); *B32B 2250/03* (2013.01); *B32B 2250/04* (2013.01); *B32B 2250/05* (2013.01); *B32B 2250/244* (2013.01); *B32B 2250/40* (2013.01); *B32B 2255/26* (2013.01); *B32B 2264/102* (2013.01); *B32B 2264/104* (2013.01); *B32B 2264/12* (2013.01); *B32B 2307/206* (2013.01); *B32B 2307/40* (2013.01); *B32B 2307/402* (2013.01); *B32B 2307/4026* (2013.01); *B32B 2307/41* (2013.01); *B32B 2307/416* (2013.01); *B32B 2307/71* (2013.01); *B32B 2307/7246* (2013.01); *B32B 2367/00* (2013.01); *B32B 2457/12* (2013.01); *C08K 3/013* (2018.01); *C08K 3/22* (2013.01); *C08K 3/36* (2013.01); *C08K 2003/2227* (2013.01); *C08K 2003/2241* (2013.01); *C08L 67/02* (2013.01); *C08L 67/03* (2013.01); *H01L 31/048* (2013.01); *H01L 31/054* (2014.12); *Y02E 10/52* (2013.01); *Y10T 428/24355* (2015.01); *Y10T 428/24372* (2015.01); *Y10T 428/24413* (2015.01);
(Continued)

(58) Field of Classification Search
None
See application file for complete search history.

(56) References Cited

U.S. PATENT DOCUMENTS

| | | | | |
|---|---|---|---|---|
| 4,568,616 A | * | 2/1986 | Seifried | ............. C08J 5/18 428/480 |
| 4,568,646 A | * | 2/1986 | Lee | ............. C07K 5/06026 435/252.1 |

(Continued)

FOREIGN PATENT DOCUMENTS

| JP | 01-247428 A | * | 10/1989 |
|---|---|---|---|
| JP | 02-214735 A | * | 8/1990 |

(Continued)

OTHER PUBLICATIONS

Japanese Patent Office, International Search Report in International Patent Application No. PCT/JP2016/058090 (dated May 24, 2016).

(Continued)

*Primary Examiner* — Vivian Chen
(74) *Attorney, Agent, or Firm* — Leydig, Voit & Mayer, Ltd.

(57) ABSTRACT

The object of the present invention is to provide a white polyester film for a solar cell that is excellent in transfer-mark concealment properties (properties that transferred irregularities are hard to be seen) while having high whiteness, and exhibiting good light resistance and hydrolysis resistance, a sealing sheet for a back surface of a solar cell and a solar cell module using the same. The white polyester film for a solar cell of the present invention has whiteness of 50 or more, an average reflectance of 50 to 95% in a range of wavelength of 400 to 800 nm, an acid value of 1 to 50 eq/ton, and a thickness of 30 to 380 μm, and the film has a multilayer structure in which a polyester resin layer containing inorganic fine particles in an amount of 10 to 38% by mass is disposed as at least one outermost layer, and a half-value width of protrusion distribution on a surface of the polyester resin layer is 200 to 1000 nm, the protrusion distribution being obtained by plotting the number density of protrusions with respect to protrusion height.

6 Claims, No Drawings

(51) Int. Cl.
  *B32B 27/36* (2006.01)
  *H01L 31/049* (2014.01)
  *H01L 31/054* (2014.01)
  *B32B 27/08* (2006.01)
  *B32B 27/20* (2006.01)
  *B32B 7/12* (2006.01)
  *B32B 27/30* (2006.01)
  *C08K 3/013* (2018.01)
  *C08K 3/36* (2006.01)
  *C08K 3/22* (2006.01)
  *C08L 67/02* (2006.01)
  *C08L 67/03* (2006.01)

(52) U.S. Cl.
  CPC ...... *Y10T 428/24421* (2015.01); *Y10T 428/25* (2015.01); *Y10T 428/256* (2015.01); *Y10T 428/259* (2015.01); *Y10T 428/31786* (2015.04)

(56) References Cited

U.S. PATENT DOCUMENTS

| | | | | |
|---|---|---|---|---|
| 4,818,581 | A * | 4/1989 | Katoh | C08J 5/18 428/143 |
| 5,051,292 | A * | 9/1991 | Katoh | G11B 5/7305 428/141 |
| 5,374,467 | A * | 12/1994 | Sato | B32B 27/20 428/143 |
| 2002/0012169 | A1* | 1/2002 | Kashima | G02B 5/3008 359/489.11 |
| 2007/0139783 | A1* | 6/2007 | Furuya | G02B 1/111 359/606 |
| 2008/0062481 | A1* | 3/2008 | Moriya | H04N 1/40068 358/518 |
| 2009/0011285 | A1* | 1/2009 | Nakamura | G11B 5/70 428/847.2 |
| 2009/0065055 | A1* | 3/2009 | Fujii | B32B 27/20 136/259 |
| 2010/0190037 | A1* | 7/2010 | Kinoshita | B32B 27/20 428/837 |
| 2012/0120344 | A1* | 5/2012 | Kuroda | G02B 5/0231 349/62 |
| 2012/0183761 | A1* | 7/2012 | Hamamoto | C08G 63/826 428/316.6 |
| 2012/0183792 | A1* | 7/2012 | Mizuno | H01L 31/02167 428/458 |
| 2013/0112271 | A1* | 5/2013 | Ikehata | B32B 27/08 136/259 |
| 2015/0068601 | A1* | 3/2015 | Ikehata | B32B 27/08 136/259 |

FOREIGN PATENT DOCUMENTS

| | | | |
|---|---|---|---|
| JP | H11-261085 | A | 9/1999 |
| JP | 2000-114565 | A | 4/2000 |
| JP | 2002-134771 | A | 5/2002 |
| JP | 2004-247390 | A | 9/2004 |
| JP | 2006-270025 | A | 10/2006 |
| JP | 2007-184402 | A | 7/2007 |
| JP | 2007-208179 | A | 8/2007 |
| JP | 2008-085270 | A | 4/2008 |
| JP | 2010-099878 | A * | 5/2010 |
| JP | 2013-120313 | A | 6/2013 |
| WO | WO 2007/105306 | A1 | 9/2007 |
| WO | WO 2011/040398 | A1 | 4/2011 |
| WO | WO 2011/118305 | A * | 9/2011 |
| WO | WO 2011/118305 | A1 | 9/2011 |
| WO | WO 2013/051661 | A * | 4/2013 |
| WO | WO 2013/051661 | A1 | 4/2013 |
| WO | WO 2013/137196 | A * | 9/2013 |

OTHER PUBLICATIONS

Chinese Patent Office, Notification of First Office Action in Chinese Patent Application No. 201680016236.1 (dated Oct. 12, 2018).
European Patent Office, Extended European Search Report in European Patent Application No. 16768541.1 (dated Sep. 28, 2018).
European Patent Office, Communication Pursuant to Article 94(3) EPC in European Patent Application No. 16768541.1 (dated May 23, 2019).
Taiwanese Patent Office, Office Action in Taiwanese Patent Application No. 105108199 (dated Apr. 10, 2019).

\* cited by examiner

WHITE POLYESTER FILM FOR A SOLAR CELL, SEALING SHEET FOR BACK SURFACE OF SOLAR CELL USING SAME, AND SOLAR CELL MODULE

CROSS-REFERENCE TO RELATED APPLICATIONS

This patent application is the U.S. national phase of International Patent Application No. PCT/JP2016/058090, filed Mar. 15, 2016, which claims the benefit of Japanese Patent Application No. 2015-057684, filed on Mar. 20, 2015, which are incorporated by reference in their entireties herein.

TECHNICAL FIELD

The present invention relates to a white polyester film for a solar cell that is excellent in properties that transferred irregularities are hard to be seen (transfer-mark concealment properties) while maintaining high whiteness, good light reflectivity, light resistance, and hydrolysis resistance, and a sealing sheet for a back surface of a solar cell and a solar cell module using the same.

BACKGROUND ART

Recently, solar cells are receiving public attention as a clean energy source of the next generation. In a solar cell module, a component such as a sealing sheet for a back surface which seals the back surface of the solar cell module is used and a film is used for the components thereof. Since a solar cell is used in outside for a long period of time, the components thereof and the film used for the components thereof are required to be durable under natural environment (such as light resistance and hydrolysis resistance).

As to the base film used in the sealing sheet for a back surface of a solar cell, there has been used a fluorine film, a polyethylene film or a polyester film to which a white pigment and the like are added, for the purpose of enhancing UV resistance, concealment properties and the like (Patent Documents 1 to 10).

Among these, Patent Document 10, which is disclosed by the applicant of the present invention, discloses a film having a multilayer structure in which a layer concentrically containing inorganic fine particles that contains inorganic fine particles in an amount of 10 to 35% by mass is disposed as at least one outermost layer to achieve a white polyester film for a solar cell that is excellent in environmental durability represented by light resistance and hydrolysis resistance while having high whiteness and good light reflectivity. It is described that titanium dioxide or barium sulfate, which is a white pigment, is preferably used as the above-mentioned inorganic fine particle from the view of the improvement of whiteness and productivity, and an example using titanium dioxide alone is described in the Example.

Furthermore, Patent Documents 11 and 12 disclose a white polyester film being suitably used for a reflector for a liquid crystal display and the like and having excellent luminance characteristics and the like.

Patent Document 11 discloses a white polyester film in which a skin layer (B) is provided on at least one surface of a polyester layer (A) containing air bubbles, and the skin layer (B) contains 5 to 30% inorganic particles (c) having a prescribed apparent density. It is described in Patent Document 11 that the polyester layer (A) containing air bubbles is required in terms of optical characteristics such as luminance and reflectance. In addition, it is described that the above-mentioned amount of the inorganic particles (c) is necessary for controlling the center plane average roughness (Ra) and the ten-point average roughness (Rz) of the film surface of the polyester (A) side to provide irregularities on the film surface, and hence the glossiness of the film can be lowered and luminance unevenness can be reduced.

Patent Document 12 discloses a white film having at least a layer A composed of polyester and a layer B composed of polyester, wherein the layer B has air bubbles, the layer A contains three types of inorganic particles of rutile type titanium oxide, barium sulfate and silicon dioxide. It is described that the layer B is whitened due to the presence of fine air bubbles in the film, and the formation of the fine air bubbles is achieved, for example, by allowing a polymer which is non-compatible with polyester to be finely dispersed and contained in polyester or allowing a polymer which is non-compatible with polyester and inorganic particles to be finely dispersed and contained in polyester, and stretching the resulting film. It is also described that in the layer A, by using the above-mentioned three types of inorganic particles in combination, anti UV performance, reduction in luminance unevenness, high reflectance, suppression of occurrence of flaws of a light guide plate and screen non-uniformity due to adhesion can be satisfied at the same time; and in particular, it is necessary to complementarily combine barium sulfate with rutile type titanium oxide, whereby good reflectance can be obtained, and luminance unevenness can be reduced. Furthermore, it is described that it is possible to allow a large number of fine air bubbles to be present even in the layer A since barium sulfate is non-compatible with polyester.

PRIOR ART DOCUMENTS

Patent Documents

Patent Document 1: JP-A-11-261085
Patent Document 2: JP-A-2000-114565
Patent Document 3: JP-A-2004-247390
Patent Document 4: JP-A-2002-134771
Patent Document 5: JP-A-2006-270025
Patent Document 6: JP-A-2007-184402
Patent Document 7: JP-A-2007-208179
Patent Document 8: JP-A-2008-85270
Patent Document 9: WO2007-105306
Patent Document 10: WO2013-051661
Patent Document 11: JP-A-2013-120313
Patent Document 12: WO2011-118305

SUMMARY OF THE INVENTION

Problems to be Solved by the Invention

As also described in Patent Documents 1 to 10, the white base film is used as a component of the sealing sheet for a back surface of a solar cell, whereby it is possible to reflect sunlight and increase power generation efficiency. Furthermore, it is possible to impart a function of excellent environmental durability to the sealing sheet by increasing the hydrolysis resistance and anti UV performance (light resistance) of the film.

However, there has been a problem that when the base film is made white, surface irregularities transferred during the processing step of the sealing sheet for a back surface of a solar cell or the solar cell module are exposed due to reflection of light, and the exposed surface of the solar cell appears not to be a clean flat plane but to be uneven. The surface irregularities here may occur in every processing step and can be visually recognized as impressions or transfer marks formed by transferring floor surface patterns and the like when putting on the floor. Such transfer marks are exposed due to the presence of a strongly reflecting part and a weakly reflecting part when light from a given angle is reflected by the film surface.

On the other hand, as described in Patent Document 11, light-diffusing properties can be improved with adding inorganic particles at a high concentration and roughening the film surface. However, the strongly reflecting part of light and the weakly reflecting part of light generated by the surface irregularities transferred to the film cannot be necessarily eliminated just by roughening the surface, and this technique does not fundamentally solve the problem of the transfer marks as described above.

In view of the above problem, an object of the present invention is to provide a white polyester film for a solar cell that is excellent in transfer-mark concealment properties while having high whiteness, good light reflectivity, and environmental durability (light resistance and hydrolysis resistance), a sealing sheet for a back surface of a solar cell and a solar cell module using the same.

Solution to the Problems

The present invention adopts the following means in order to solve the above problem:

Item 1

A white polyester film for a solar cell, wherein the film has whiteness of 50 or more, an average reflectance of 50 to 95% in a range of wavelength of 400 to 800 nm, an acid value of 1 to 50 eq/ton, and a thickness of 30 to 380 μm, wherein the film has a multilayer structure in which a polyester resin layer containing inorganic fine particles in an amount of 10 to 38% by mass is disposed as at least one outermost layer, and wherein a half-value width of protrusion distribution on a surface of the polyester resin layer is 200 to 1000 nm, the protrusion distribution being obtained by plotting the number density of protrusions with respect to protrusion height.

Item 2

The white polyester film for a solar cell according to item 1, wherein the polyester resin layer is a layer containing two or more types of inorganic fine particles.

Item 3

The white polyester film for a solar cell according to item 2, wherein a difference in average particle diameter between at least two types of inorganic fine particles of the two or more types of inorganic fine particles is 1.7 μm or more.

Item 4

The white polyester film for a solar cell according to any of items 1 to 3, wherein the polyester resin layer contains inorganic fine particles I having an average particle diameter of 0.1 μm to 1.7 μm and inorganic fine particles II having an average particle diameter of 1.8 μm to 7.0 μm, and a difference in average particle diameter between the inorganic fine particles I and the inorganic fine particles II is 1.7 μm or more.

Item 5

The white polyester film for a solar cell according to any of items 1 to 4, wherein the polyester resin layer contains at least titanium dioxide mainly composed of a rutile type.

Item 6

The white polyester film for a solar cell according to any of items 1 to 5, wherein the polyester resin layer does not contain barium sulfate.

Item 7

The white polyester film for a solar cell according to items 4, wherein the polyester resin layer has a larger thickness than the average particle diameter of the inorganic fine particles II.

Item 8

The white polyester film for a solar cell according to item 4, wherein the inorganic fine particles I comprises titanium dioxide mainly composed of a rutile type.

Item 9

A sealing sheet for a back surface of a solar cell using the white polyester film for a solar cell according to any of items 1 to 8.

Item 10

A solar cell module comprising the sealing sheet for a back surface of a solar cell according to item 9, an encapsulation resin layer adjacent to the sealing sheet for a back surface of a solar cell, and a solar cell device embedded in the encapsulation resin layer.

Effects of the Invention

The white polyester film for a solar cell of the present invention has high whiteness, good light reflectivity and environmental durability (light resistance, and hydrolysis resistance) and moreover has excellent transfer-mark concealment properties. By using the white polyester film for a solar cell of the present invention, a sealing sheet for a back surface of a solar cell and a solar cell module that are excellent in appearance after processing, inexpensive, and light in weight while having excellent light reflectivity and excellent environmental durability can be provided.

MODE FOR CARRYING OUT THE INVENTION

The inventors of the present invention made studies to solve the above-mentioned problem caused by the transfer marks even after disclosing Patent Document 10. As a result, the inventors have found that with regard to a layer in which the content of inorganic fine particles overlaps substantially with the content of inorganic fine particles in the layer concentrically containing inorganic fine particles (a polyester resin layer containing inorganic fine particles in an amount of 10 to 35% by mass) described in Patent Document 10, the above-mentioned object can be achieved by controlling the half-value width of the protrusion distribution obtained by plotting the number density of protrusions with respect to protrusion height on the surface of the layer to be 200 to 1000 nm, and thus the present invention has been completed.

Specifically, the white polyester film for a solar cell of the present invention has whiteness of 50 or more, an average reflectance of 50 to 95% in the range of a wavelength of 400 to 800 nm, an acid value of 1 to 50 eq/ton, and a thickness of 30 to 380 μm, and has a multilayer structure in which a polyester resin layer containing inorganic fine particles in an amount of 10 to 38% by mass is disposed as at least one outermost layer, and a half-value width of protrusion distribution on the surface of the polyester resin layer containing inorganic fine particles in an amount of 10 to 38% by mass is 200 to 1000 nm, the protrusion distribution being obtained by plotting the number density of protrusions with respect to protrusion height. Hereinafter, the polyester resin layer containing inorganic fine particles in an amount of 10 to 38% by mass is referred to as a "layer concentrically containing inorganic fine particles" as in Patent Document 10. The "layer concentrically containing inorganic fine particles" of the present invention is different from the "layer concentrically containing inorganic fine particles" described in Patent Document 10 in that the half-value width of the protrusion distribution is controlled within a predetermined range. The details will be described later.

Hereinafter, requirements for constituting the white polyester of the present invention will be described in detail <Polyester Resin>

The polyester resins used for the white polyester film for a solar cell used in the present invention is those prepared by polycondensing an aromatic dicarboxylic acid or an ester thereof such as terephthalic acid, isophthalic acid, naphthalene dicarboxylic acid with a glycol such as ethylene glycol, butylene glycol, diethylene glycol, 1,4-butane diol, neopentyl glycol. The polyester resin may be a homopolymer obtained by polymerizing these components or a copolymer obtained by copolymerizing these components with a third component.

A representative example of the polyester resin includes polyethylene terephthalate, polybutylene terephthalate, polyethylene-2,6-naphthalate, and the like.

In the case where the third component is copolymerized, the mol ratio of ethylene terephthalate unit, butylene terephthalate unit or ethylene-2,6-naphthalate unit is preferably 70% by mol or more, more preferably 80% by mol or more, and even preferably 90% by mol or more.

The polyester resin can be manufactured by a method of directly polycondensing an aromatic dicarboxylic acid and a glycol; a method of carrying out ester-changing reaction of an alkyl ester of an aromatic dicarboxylic acid with a glycol, and subsequently polycondensing the resulting product; a method of polycondensing diglycol esters of aromatic dicarboxylic acids and the like.

A polycondensation catalyst includes an antimony compound, a titanium compound, a germanium compound, a tin compound, aluminum and/or aluminum compound, a phosphorus compound having an aromatic ring in a molecular, an aluminum salt of a phosphorus compound, and the like.

The thermal stability of the polyester resin can be further improved by removing the catalyst from the obtained polyester resin after polycondensation or inactivating the catalyst by adding a phosphorus compound and the like. In addition, the multiple catalysts may be contained in appropriate amounts, as long as problems such as properties of the polyester resin, processability, and color are not caused.

When the polyester resin is manufactured, dialkylene glycol is produced as a byproduct at the time of esterification of terephthalic acid or the time of transesterification of dimethyl terephthalic acid. In the case where dialkylene glycol is contained in the polyester resin in a large amount, heat resistance may be lowered when the obtained film is exposed to environment of high temperature. Therefore, it is preferable that the content of dialkylene glycol of the polyester resin used in the present invention is controlled in a given range.

Specifically, in the case of diethylene glycol as a representative dialkylene glycol, the content of diethylene glycol of the polyester resin is preferably 2.3% by mol or less, more preferably 2.0% by mol or less, and even preferably 1.8% by mol or less. When the content of diethylene glycol is less than 2.3% by mol, the heat stability can be improved, so that the increase of an acid value from decomposition at the time of drying or molding can be suppressed. In addition, it is better that the content of diethylene glycol is small and it is produced as a byproduct in the case of the production of the polyester resin. The lower limit of the content of diethylene glycol is practically 1.0% by mol, and more practically 1.2% by mol.

In order to give the polyester film durability in the present invention, the intrinsic viscosity of the polyester resin used is preferably 0.65 dl/g or more, more preferably 0.67 dl/g or more, preferably 0.90 dl/g or less, more preferably 0.75 dl/g or less. When the intrinsic viscosity of the polyester resin is controlled in the above range, the productivity can be improved and the hydrolysis resistance and heat resistance of the formed film can be heightened. In the case where the intrinsic viscosity is less than 0.65 dl/g, the hydrolysis resistance and heat resistance of the formed film may be lowered. In addition, in the case where the intrinsic viscosity is higher than 0.90 dl/g, the productivity may be lowered. It is desirable that solid phase polymerization is carried out after polymerization in order to control the intrinsic viscosity of the polyester resin in the above range.

The carboxyl terminal of the polyester resin contributing to the acid value has the action for improving hydrolysis by self catalyst action. In order to obtain high hydrolysis resistance as a member for a solar cell, it is important that the acid value of the white polyester film for a solar cell of the present invention is in the range of 1 to 50 eq/ton with respect to polyester (details will be described later).

In order to adjust the acid value of the film in the above range, it is preferable that the acid value of the polyester resin used as the raw material is controlled in a given range. Specifically, the acid value of the polyester resin is preferably less than 50 eq/ton, more preferably 25 eq/ton or less, and even preferably 20 eq/ton or less. In addition, it is preferable that the acid value of the film is small, and the lower limit of the acid value is 0.5 eq/ton in view of the productivity. The acid value of the polyester resin and the film can be determined by a titration method as set forth below.

In order to control the acid value of the polyester resin in the above range, polymerization conditions of the resin, specifically, production apparatus factors such as the structure of an esterification reaction apparatus, the composition ratio of a dicarboxylic acid and glycol in a slurry to be supplied to the esterification reaction apparatus, the esterification reaction conditions such as the esterification reaction temperature, the esterification reaction pressure, and the esterification reaction time, and solid-state polymerization conditions and the like may be set appropriately. In addition, it is effective that the water content of polyester tips to be supplied to extruder machine or the temperature of resins in melting step is controlled. Further, it is preferable that a carboxyl terminal is blocked with an epoxy compound, a carbodiimide compound and the like. In addition, it is preferable that the polymerization is carried out under nitrogen atmosphere, and, if possible, the prevention of contamination of oxygen.

For example, in order to suppress the increase in the acid value when feeding a polyester chip to the extruder, it is preferred to use a sufficiently dried polyester chip. Specifically, the water content of the polyester chip is preferably 100 ppm or less, more preferably 50 ppm or less, and further preferably 30 ppm or less.

As the method of drying the polyester chip, a known method such as drying under reduced pressure and drying by heating can be used. For example, in the case of drying by heating, the heating temperature is preferably 100 to 200° C. and more preferably 120 to 180° C. The drying time is preferably 1 hour or more, more preferably 3 hours or more, and further preferably 6 hours or more.

In addition, in order to suppress the acid value of the polyester resin, it is also effective to control the resin temperature in the melting step into a certain range. Specifically, the melting temperature of the polyester chip in the extruder is preferably 280 to 310° C. and more preferably 290 to 300° C. The back pressure on the filtration in the extruder reduces by raising the melting temperature, and good productivity can be exhibited. However, in a melting temperature higher than 310° C., thermal degradation of the resin progresses, and the acid value of the resin increases, thus there may be the case where hydrolysis resistance of the obtained film lowers.

One kind or multiple kinds of additives such as a fluorescent brightening agent, an ultraviolet absorber, an infrared ray-absorbing pigment, a heat stabilizer, a surfactant, an antioxidant can be contained in the polyester resin according to the purpose to be used.

Examples of the antioxidant may include aromatic amine antioxidants and phenolic antioxidants. Examples of the heat stabilizer may include phosphorus type heat stabilizers such as phosphoric acid and phosphate ester, sulfur type heat stabilizers, and amine type heat stabilizers.

<Layer Concentrically Containing Inorganic Fine Particles>

The white polyester film for a solar cell of the present invention includes a polyester resin layer containing the inorganic fine particle in an amount of 10 to 38% by mass (a layer concentrically containing inorganic fine particles) as one outermost layer (in the side receiving direct solar light and in the side opposite to an encapsulation resin layer). The content of inorganic fine particles in the layer concentrically containing inorganic fine particles is preferably 10% by mass or more and 35% by mass or less, more preferably 11% by mass or more and 30% by mass or less, and further preferably 12% by mass or more and 23% by mass or less. The content of less than 10% by mass is not preferable since whiteness and transfer-mark concealment properties may not be sufficiently developed, and the content of more than 38% by mass is not preferable since foreign substance may be generated and film quality and film surface strength may be reduced due to aggregation.

In the present invention, it is important that on the surface of the above-mentioned layer concentrically containing inorganic fine particles, the half-value width of the protrusion distribution obtained by plotting the number density of protrusions with respect to protrusion height is controlled to be 200 to 1000 nm. Thus, high transfer-mark concealment properties, which cannot be obtained in the above-mentioned Patent Document 10 and the like, are imparted.

For imparting excellent transfer-mark concealment properties, the half-value width of the protrusion distribution is 200 to 1000 nm, preferably 250 nm to 950 nm, and more preferably 300 nm to 950 nm. When the half value width is less than 200 nm, the transfer-mark concealment properties is poor, and surface irregularities are conspicuous. When the half value width exceeds 1000 nm, the inorganic fine particles present on the surface of the layer concentrically containing inorganic fine particles tend to slip at the time of handling in the processing step. When the half-value width of the protrusion distribution is adjusted to the above range, distributed protrusions diffuse light incident from a wider range of angles, whereby the weakly reflecting part and the strongly reflecting part caused by the transfer marks are reduced, and the transfer marks can be prevented from being exposed.

Here, the half-value width of the protrusion distribution obtained by plotting the number density of protrusions with respect to protrusion height is measured as follows. Using a three-dimensional roughness tester of stylus type (SE-3AK; manufactured by Kosaka Kenkyusho), under the conditions of a needle tip radius of 2 μm and a load of 30 mg, measurement is performed at a cut-off value of 0.25 mm in the longitudinal direction of the film and at a needle moving speed of 0.1 mm/second over a measurement length of 1 mm, then the result is divided into 500 points with 2-μm pitch, and the height of each point is put into a three-dimensional roughness analyzer (TDA-21). This operation is continuously repeated 150 times at intervals of 2 μm in the width direction of the film, that is, over 0.3 mm in the width direction of the film, and the measured data is put into the analyzer. Next, using the analyzer (TDA-21), a peak particle distribution is calculated by setting the item "slice level equal interval" to 0.05 μm, and the number density of protrusions (number/mm$^2$) for each protrusion height (in increments of 0.05 μm-level) is obtained. That is, the number density of protrusions (number/mm$^2$) for each protrusion height of 0 μm, 0.05 μm, 0.10 μm, 0.15 μm, and so on is determined. Then, as to the obtained data, the protrusion distribution is obtained by plotting the number density (number/mm$^2$) of protrusions on the vertical axis and protrusion height (nm) on the horizontal axis. The protrusion distribution width (nm) at a position of half the peak height of the protrusion distribution is taken as the half-value width.

It is desirable that the protrusion distribution obtained as described above includes one peak of distribution. Although the protrusion distribution may include a plurality of peaks, it is preferred that the peaks occur continuously. When the protrusion distribution includes a plurality of peaks, a distribution width at a position of half the peak height of each peak is measured, and the largest value of the measured distribution widths is set as the half-value width.

In the present invention, in order to cause the half-value width of the protrusion distribution to be within a specific range, it is preferable to add two or more different types of inorganic fine particles to the layer concentrically containing inorganic fine particles. When only one type of white inorganic fine particles is used, the protrusion distribution on the surface of the layer concentrically containing inorganic fine particles becomes sharp and the above-mentioned half-value width may become small, leading to insufficient transfer-mark concealment properties. Note that the term "different types" refers to a case of having different average particle diameters, a case of having different compositions, or a case of having different average particle diameters and different compositions.

Furthermore, the difference in average particle diameter between at least two types of inorganic fine particles is preferably 1.7 μm or more, more preferably 2 μm or more, and further preferably 2.1 μm or more. When the difference in average particle diameter is less than 1.7 μm, the distribution of the protrusion height on the film surface narrows and the half-value width becomes small, so that light from a given angle cannot be diffused in many directions, resulting in insufficient transfer-mark concealment properties. When the difference in average particle diameter exceeds 6.9 μm, there is a possibility that the protrusion distribution includes a plurality of peaks, and the half-value width may become small, so that the transfer-mark concealment properties may also deteriorate. Therefore, the difference in average particle diameter is preferably 6.9 µm or less, more preferably 6.5 µm or less, and further preferably 6.4 µm or less.

The average particle diameter of the inorganic fine particles in the present invention can be determined by electron microscopy as described below. Concretely, the inorganic fine particles are observed by a scanning electron microscope (SEM), the magnification is properly changed in accordance with the size of the particles, as for 100 particles selected at random, the maximum diameter of each particle (a distance between the most separated two points on the particle) is measured, and the mean value is defined as the average particle diameter.

Specifically, it is preferred that the two or more types of inorganic fine particles used in the layer concentrically containing inorganic fine particles include the following inorganic fine particles I and inorganic fine particles II.

The inorganic fine particles I are preferably made of a white pigment from the viewpoint of improving whiteness and productivity. Titanium dioxide is especially preferable. Besides titanium dioxide, barium sulfate is also known as a white pigment, but even if barium sulfate is used, improvement of weather resistance (hydrolysis resistance) of the film cannot be expected. Furthermore, since barium sulfate has a function of air bubble formation in polyester, a large number of fine air bubbles are likely to be formed in the layer concentrically containing inorganic fine particles in the embodiment using barium sulfate in combination with titanium dioxide as in the aforementioned Patent Document 12, thereby decreasing the surface strength of the film. Therefore, in the present invention, from the viewpoint of keeping the light resistance and the surface strength of the film high, it is preferred that the layer concentrically containing inorganic fine particles be a layer not containing fine air bubbles (that is, a layer not containing barium sulfate). The inorganic fine particles I are preferably composed of titanium dioxide only.

The average particle diameter of the inorganic fine particles I is preferably 0.1 µm or more, more preferably 0.2 µm or more, and further preferably 0.25 µm or more, and preferably 1.7 µm or less, more preferably 1.3 µm or less, further preferably 1.0 µm or less, still further preferably 0.7 µm or less, and particularly preferably 0.5 µm or less. When the average particle diameter of the inorganic fine particles I is within the above range, the whiteness of the film can be increased due to the light scattering effect and film production can be suitably carried out. On the other hand, when the average particle diameter of the inorganic fine particles I is less than 0.1 µm, the whiteness required of the film may not be obtained due to insufficient light scattering effect. When the average particle diameter of the inorganic fine particles I is more than 1.7 µm, the film may be easily broken during film production, and the film may not be produced successfully.

The added amount of the inorganic fine particles I is preferably 9.7 to 35.8% by mass relative to the layer concentrically containing inorganic fine particles. The content of the inorganic fine particles I in the layer concentrically containing inorganic fine particles is more preferably 10.6% by mass or more, and further preferably 11.2% by mass or more, and more preferably 28% by mass or less, and further preferably 21.4% or less. When the content of the inorganic fine particles I is within the above range, a white polyester film for a solar cell having high whiteness and reflectance as well as excellent environmental durability can be obtained. On the other hand, when the content of the inorganic fine particles I is less than 9.7% by mass, the whiteness and the reflectance of the film are insufficient, so that light deterioration of the film is easily caused. In addition, when the content of the inorganic fine particles I is more than 35.8% by mass, much heat history is needed to disperse uniformly the inorganic fine particles I in the polyester resin layer, and deterioration of the resin may be caused.

The solar cell receives the radiation of sunlight for a long period of time at outdoor, and the solar cell is required for resistance to photo-deterioration (light resistance). From the view of the improvement of light resistance, it is preferable that the inorganic fine particles I are titanium dioxide fine particles mainly composed of a rutile type.

Mainly two crystal forms of titanium oxide, rutile type and anatase type, are known and the anatase type has considerably high spectral reflectance of ultraviolet rays, whereas the rutile type has high absorbance of ultraviolet rays (low spectral reflectance). The present inventors pay attention to the difference of the spectral properties of the crystal forms of titanium dioxide and consequently improve the light resistance in a film, and can decrease the coloring from light deterioration of the film, by utilizing the ultraviolet absorption performance of the rutile type. Consequently, the more preferable embodiment of the present invention provides a film excellent in light resistance under light irradiation substantially without adding another ultraviolet absorber. Therefore, a problem such as pollution due to bleeding out of the ultraviolet absorber or decrease in adhesion is scarcely caused.

Herein, "mainly" means that the amount of rutile type titanium dioxide in all of the titanium dioxide fine particles exceeds 50% by mass. Further, the amount of anatase type titanium dioxide in all of the titanium dioxide fine particles is preferably 10% by mass or lower, more preferably 5% by mass or lower and most preferably 0% by mass. If the content of anatase type titanium dioxide exceeds 10% by mass, the amount of rutile type titanium dioxide is decreased in all of the titanium dioxide fine particles and thus the ultraviolet absorption performance sometimes becomes insufficient and also since anatase type titanium dioxide has high photocatalytic function, the light resistance tends to be lowered due this function. Rutile type titanium dioxide and anatase type titanium dioxide can be distinguished by x-ray structural diffraction and spectral absorption properties.

The surface of the titanium dioxide fine particles mainly composed of the rutile type may be subjected to inorganic treatment with alumina or silica, or to silicon type or alcohol type organic treatment.

On the other hand, examples of the inorganic fine particles II are not particularly limited, and include silica, kaolinite, talc, calcium carbonate, zeolite, alumina, and the like. Among these, silica and zeolite are preferable, and silica is more preferable. From the viewpoint of widening the half-value width of the protrusion distribution to 200 nm or more, silica having pores is particularly preferable.

The average particle diameter of the inorganic fine particles II is preferably larger than the average particle diameter of the inorganic fine particles I. The average particle diameter of the inorganic fine particles II is preferably 1.8 µm or more, and more preferably 2.2 µm or more, and preferably 7.0 µm or less, and more preferably 6.8 µm or less. If the average particle diameter of the inorganic fine particles II is less than 1.8 µm, transfer-mark concealment properties are poor, and surface irregularities become conspicuous. On the other hand, if the average particle diameter of the inorganic fine particles II exceeds 7.0 µm, the strength against surface peeling after accelerated hydrolysis is reduced, and the quality as a white film for a solar cell may deteriorate.

The added amount of the inorganic fine particles II is preferably 0.3 to 2.2% by mass relative to the layer concentrically containing inorganic fine particles. The content of the inorganic fine particles II in the layer concentrically containing inorganic fine particles is more preferably 0.4% by mass or more and 2.0% or less, and further preferably 0.6% by mass or more and 2.0% or less. If the content of the inorganic fine particles II is less than 0.3% by mass, sufficient transfer-mark concealment properties cannot be obtained. On the other hand, if the content of the inorganic fine particles II is more than 2.2% by mass, the surface strength disadvantageously becomes insufficient.

As for the addition ratio of the above-mentioned two types of inorganic particles, when the amount of the inorganic fine particles I is taken as 100% by mass, the amount of the inorganic fine particles II is preferably 0.85% by mass or more and 22% by mass or less, more preferably 1.4% by mass or more and 17% by mass or less, and further preferably 3.8 mass % or more and 14 mass % or less. If the amount of the inorganic fine particles II is less than 0.85% by mass relative to the amount of the inorganic fine particles I, sufficient transfer-mark concealment properties may not be obtained. On the other hand, if the amount of the inorganic fine particles II is more than 22% by mass, the surface strength may be reduced due to aggregation.

In addition to the inorganic fine particles I and the inorganic fine particles II described above, the layer concentrically containing inorganic fine particles may further contain other inorganic fine particles within a range that the half-value width of the protrusion distribution of 200 to 1000 nm can be secured. As described above, when only the inorganic fine particles I composed of white inorganic fine particles are used, the protrusion distribution on the surface of the layer concentrically containing inorganic fine particles becomes sharp, the half-value width may become small, resulting in deteriorating the transfer-mark concealment properties. When three or more types of inorganic fine particles are used, foreign substance are generated due to aggregation between different types of particles, the film quality may deteriorate, and thus caution is required. It is preferable to use two types of the inorganic fine particles I and the inorganic fine particles II.

The thickness of the layer concentrically containing inorganic fine particles is preferably larger than the average particle diameter (1.8 to 7.0 µm) of the inorganic fine particles II. It is not preferred that the thickness of the layer concentrically containing inorganic fine particles be smaller than the average particle diameter of the inorganic fine particle II because the half-value width of the protrusion distribution may become small, and the transfer-mark concealment properties tend to deteriorate. Specifically, the thickness of the layer concentrically containing inorganic fine particles is preferably 2 to 100 µm, more preferably 2.4 to 95 µm, and further preferably 4 to 80 µm.

A conventionally known method for adding the above-mentioned inorganic fine particles to a polyester film can be employed and a master-batch method (MB method) of previously mixing a polyester resin and inorganic fine particles by an extruder is preferable in the view of the decrease of the heat history. Further, it is also possible to employ a method of charging a polyester resin which is not previously dried and inorganic fine particles to an extruder and producing MB while removing water or degassing air. Preferably, a method of producing MB using a polyester resin which is previously dried more or less can more suppress increase in the acid value of the polyester resin. In this case, examples to be employed include a method of preparing MB while degassing and a method of preparing MB by using a polyester resin which is sufficiently dried without degassing. Since the adding method of inorganic fine particles to the polyester resin is controlled as shown in the above, the inorganic fine particles are contained in the large amount, while the acid value of the polyester resin can be appropriately kept at lower level, so that the film having high whiteness and light reflectance and meeting both light resistance and hydrolysis resistance can be easily obtained.

In the case of producing MB as described above, it is preferable to lower the moisture content for a polyester resin to be charged, by previously drying. As drying condition, drying is carried out preferably at 100 to 200° C. and more preferably at 120 to 180° C. for preferably 1 hour or longer, more preferably 3 hours or longer, and even preferably 6 hours or longer. Accordingly, the polyester resin is dried so sufficiently as to adjust the moisture amount to be preferably 50 ppm or lower and more preferably 30 ppm or lower.

In the case of producing MB while degassing, it is preferable to employ a method of melting a polyester resin at a temperature of 250° C. to 300° C., preferably 270° C. to 280° C., providing one, preferably two or more degassing openings in a preliminary kneader, keeping the inside of a mixing apparatus under reduced pressure by continuously suction-degassing at 0.05 MPa or higher, preferably 0.1 MPa or higher and maintaining decompression in the mixer and the like.

A preliminary mixing method is not particularly limited and a batch method or a uniaxial or biaxial kneading extruder may be employed.

<Layer Structure of White Polyester Film for Solar Cell>

In the white polyester film for a solar cell of the present invention, the above-mentioned layer concentrically containing inorganic fine particles is disposed as at least one outermost layer. By allowing the layer containing the inorganic particles in a large amount to be disposed as an outermost layer in the side receiving direct solar light, when the above-mentioned film is used, for example, as a back sheet, it is possible to efficiently prevent the decrease in light resistance of the film itself as well as a member film, a sheet and an adhesive layer of an inner layer constituting the back sheet due to ultraviolet rays or the like.

The white polyester film for a solar cell of the present invention has a multilayer structure in which the layer concentrically containing inorganic fine particles is disposed as described above. The multilayer structure means a laminate having at least two layers. Specifically, for example, in the case where the layer concentrically containing inorganic fine particles is a layer A, and other layer in which the content of the inorganic fine particles is smaller than that of the layer concentrically containing inorganic fine particles (the layer A) is a layer B, a layer structure such as a two-layer structure of the layer A/the layer B and a three-layer structure of the layer A/the layer B/the layer A in sequential order from the side receiving direct solar light can be adopted. Preferable layer structure is the two-layer structure or the three-layer structure, and more preferably the two-layer structure.

By forming the film of the present invention into the two-layer structure, adhesion between the film and various functional imparting layers or an encapsulation resin layer is improved. To the above-mentioned layer concentrically containing inorganic fine particles (the layer A) provided to prevent deterioration due to ultraviolet ray and the like, it is necessary to add the inorganic fine particles at a certain high degree of concentration. As a result, in the case of a single-layer structure composed only of the layer A, surface roughness becomes large, and adhesion to various function imparting layer or an encapsulation resin layer cannot be obtained easily. In contrast to this, in the case of the two-layer structure, the concentration of the inorganic fine particles contained in the other layer (the layer B) can be suppressed, and hence the above problems are not caused.

In the case where the film of the present invention is the structure of two layers (the A layer/the B layer) or three layers (the A layer/the B layer/the A layer), the thickness of the skin layer (the A layer) of the outermost layer, that is, the total thickness of the skin layer in one side or both side, to the whole layer of the film is 5 to 30%. The thickness ratio of the skin layer (the A layer) is preferably 8% or more, more preferably 10% or more, and even preferably 15% or more. The thickness ratio of the skin layer (the A layer) is preferably 28% or less, more preferably 25% or less. When the thickness ratio of the skin layer is adjusted in the above range, the white polyester film for a solar cell meeting whiteness, reflectance, and environmental durability can be obtained. On the other hand, when the thickness ratio of the skin layer is lower than the lower limit as shown in the above, the light deterioration of the film is gradually progressed to thickness direction. On the other hand, when the thickness ratio of the skin layer is higher than the upper limit as shown in the above, there is a tendency that hydrolysis resistance of the whole film is decreased.

It is preferable that the white polyester film for a solar cell of the present invention has the structure composed of two layers (the A layer/the B layer) satisfying the thickness ratio as shown in the above. The light deterioration is gradually progressed from the outermost layer in the side of direct radiation of solar light to thickness direction. Therefore, the layer concentrically containing inorganic fine particles is not separately disposed in many layers, and is disposed as one layer in the outermost layer in the side of direct radiation of solar light, so that functionality for effectively preventing light deterioration can be concentrated on the layer. In addition, in the case where the layer concentrically containing inorganic fine particles is disposed in the intermediate layer, in view of the possibility that the separation of the film is caused due to deterioration of the resin, the layer concentrically containing inorganic fine particles is preferably disposed in the outermost layer in the side of the direct radiation of the solar light. As described above, the film of the present invention is constituted by two layers, the content of the inorganic fine particle is concentrated in the outermost layer in the side of direct radiation of the solar light, and the content of the inorganic fine particles of the whole film is controlled in the small amount, so that whiteness, light reflectance, UV performance (light resistance), and hydrolysis resistance can be satisfied at higher level.

<Other Layer Containing Inorganic Fine Particle in Small Amount>

The white polyester film for a solar cell of the present invention has a laminate having at least two layers including the layer concentrically containing inorganic fine particles as the outermost layer as described above, and includes other layer containing inorganic fine particle in a small amount as a layer other than the above-mentioned layer concentrically containing inorganic fine particles. The content of the inorganic fine particles in this other layer may be smaller than the content of the inorganic fine particles in the layer concentrically containing inorganic fine particles, and the difference of the contents of the inorganic fine particles between the layer concentrically containing inorganic fine particles and the other layer is preferably 10% by mass or more. Specifically, the content of the inorganic fine particles in the above-mentioned "other layer containing inorganic fine particle in a small amount" is preferably 0.5% by mass or more and 2% by mass or less, and more preferably 0.8% by mass or more and 1.8% by mass or less. By allowing a small amount of inorganic fine particles to be contained in other layers in this manner, light resistance can be further improved.

The average particle diameter of the inorganic fine particles in the above-mentioned "other layer containing inorganic fine particle in a small amount" is not particularly limited and is preferably, for example, 0.1 μm or more and 7 μm or less.

Furthermore, in the present invention, from the viewpoint of keeping the surface strength of the film high, it is preferable that the "other layer containing inorganic fine particle in a small amount" does not contain fine air bubbles like the layer concentrically containing inorganic fine particles.

The type of the inorganic fine particles used in the "other layer containing inorganic fine particle in a small amount" is not particularly limited as long as it satisfies the above requirements, and examples thereof include titanium, silica, zeolite and the like. Of these, in view of light resistance and the like, titanium dioxide used in the layer concentrically containing inorganic fine particles described above is preferable. In particular, it is more preferable to use the same type of inorganic fine particles as the inorganic fine particle I described above.

The total content of the inorganic fine particles in the entire film of the present invention is preferably 2 to 10% by mass. More preferably, it is 3% by mass or more and 8% by mass or less.

<Function Imparting Layer>

The white polyester film for a solar cell of the present invention has the above-mentioned layer structure. When various functions such as easy adhesiveness, insulation properties, and abrasion resistance are required to the polyester film, the surface may be coated with a polymer resin by coating or the like. Also, when slipperiness is required, the coating layer may contain inorganic and/or organic particles.

Among the required functions, when easy adhesiveness is required in the film, it is preferred to dispose a coating layer using an aqueous coating liquid containing at least one of a water-soluble or water-dispersible copolyester resin, acrylic resin and polyurethane resin, on at least one surface of the film. Examples of the coating liquid include aqueous coating liquids disclosed in JP 3567927 B1, JP 3589232 B1, JP 3589233 B1, and the like.

In particular, when the white polyester film for a solar cell of the present invention is used on the surface in contact with the encapsulation resin layer of an olefin resin such as EVA (ethylene-vinylacetate copolymer) or PVB (polyvinyl butyral), it is preferred to add a polyurethane resin to an aqueous coating liquid as an easily adhesive layer, in order to effectively exhibit easy adhesion to the encapsulation resin layer. Among them, it is preferred to add a polyurethane resin containing an aliphatic polycarbonate polyol as a constituent, in terms of excellent heat resistance and hydrolysis resistance and prevention of yellowing with sunlight. Such polyurethane resin to an aqueous coating liquid is added, whereby adhesion of a film under moist heat conditions can be improved.

Examples of the aliphatic polycarbonate polyol include aliphatic polycarbonate diols, aliphatic polycarbonate triols and the like, and the number average molecular weight of the aliphatic polycarbonate diol is preferably from 1500 to 4000, and more preferably from 2000 to 3000. When the number average molecular weight of the aliphatic polycarbonate diol is less than 1500, a strong and hard urethane component increases, and stress due to thermal shrinkage of the substrate cannot be relaxed, whereby there may be the case where its adhesion lowers. Also, when the number average molecular weight of the aliphatic polycarbonate diol exceeds 4000, there may be the case where its adhesion and strength after high temperature and high humidity treatment lower.

The molar ratio of the aliphatic polycarbonate polyol is preferably 3% by mol or more and more preferably 5% by mol or more, and preferably 60% by mol or less and more preferably 40% by mol or less, in case where the total polyisocyanate component of the urethane resin is 100% by mol. When the molar ratio is less than 3% by mol, there may be the case where dispersibility in water becomes poor. On the other hand, when the molar ratio exceeds 60% by mol, water resistance lowers, thus moist heat resistance lowers.

The glass transition temperature of the polyurethane resin is not particularly limited, and is preferably lower than 0° C. and more preferably lower than −5° C. Accordingly, the viscosity of the polyurethane resin becomes close to the viscosity of the partially melted olefin resin such as EVA or PVB upon adhesion with pressure, whereby adhesion is improved due to partial mixing, and preferable softness is likely to be exhibited.

<Method for Producing White Polyester Film for a Solar Cell>

The method for producing the white polyester film for a solar cell of the present invention is not particularly limited, but a co-extrusion method including feeding a polyester chip for forming each layer to a separate extruder, then laminating it in a melted state and extruding it from the same die is preferred. For example, when a two-layer film containing a layer concentrically containing inorganic fine particles is produced, a polyester chip containing much inorganic fine particles (resin chip for the layer concentrically containing inorganic fine particles) and a polyester chip containing less inorganic fine particles (resin chip for other layers) are fed to a separate extruder, then may be laminated in a melted state and extruded from the same die.

Here, when each polyester chip is fed to the extruder, in order to suppress the increase in the acid value when feeding a polyester chip to the extruder, it is preferred to use a sufficiently dried polyester chip. Specifically, the water content of the polyester chip is preferably 100 ppm or less, more preferably 50 ppm or less, and further preferably 30 ppm or less.

As the method of drying the polyester chip, a known method such as drying under reduced pressure and drying by heating can be used. For example, in the case of drying by heating, the heating temperature is preferably 100 to 200° C. and more preferably 120 to 180° C. The drying time is preferably 1 hour or more, more preferably 3 hours or more, and further preferably 6 hours or more.

The melting temperature of the polyester chip in the above extruder is preferably 280 to 310° C. and more preferably 290 to 300° C. The back pressure on the filtration in the extruder reduces by raising the melting temperature, and good productivity can be exhibited. However, in a melting temperature higher than 310° C., thermal degradation of the resin progresses, and the acid value of the resin increases, thus there may be the case where hydrolysis resistance of the obtained film lowers.

Subsequently, the polyester resin for forming each layer melted with the separate extruder is laminated in a melted state, extruded in a sheet form from the same die, and taken off with a cooling roll to form an unstretched film.

The obtained unstretched film is stretched by a biaxial orientation processing. The stretching method includes a sequential biaxially stretching method including heating the obtained unstretched film with a heating roll or a non-contact heater, then stretching it between rolls with different speed (roll stretch), subsequently holding both ends of the film uniaxially stretched with clips, and heating it in an oven, then stretching it in a width direction (tenter stretch), and further heat fixing it by applying high heat; a simultaneous biaxially stretching method including stretching the obtained unstretched film with a tenter having a mechanism capable of longitudinally and transversely stretching it at the same time (tenter simultaneous biaxial stretch); an inflation stretching method including stretching the obtained unstretched film by expanding it by air pressure, and the like. In these stretching steps, in order to suitably retain elongation at break of the obtained film, it is preferred to keep the balance of longitudinal and transverse orientations by properly controlling longitudinal and transverse stretch ratio.

When a highly dimensional stability against heating is demanded for a film, it is desirable to apply a longitudinal relaxation treatment to the film. As a method for the longitudinal relaxation treatment, known methods, for example, a method where a longitudinal relaxation treatment is conducted by making the space between the clips of the tenter gradually narrow (JP-B-4-028218), a method where a longitudinal relaxation treatment is conducted by avoiding the influence of the clips by means of cutting the edge of the film using a razor in the tenter (JP-B-57-54290), and the like can be exemplified. Also, a method where off-line heat is applied to relax may be used. Furthermore, in the above stretching step, it is possible to impart a highly dimensional stability against heating to the film by properly controlling the stretching conditions.

In order to impart various functions to the film, it is also possible to coat the surface of the film with a polymer resin by coating or the like, and add inorganic and/or organic particles to the coating layer.

The method of imparting various functions is not particularly limited, and for example, when a coating layer for imparting easy adhesion and the like is formed, a coating layer may be provided after the film formation (off-line coating method), and may be provided during the film formation (in-line coating method). In terms of productivity, it is preferred to provide a coating layer during the film formation.

<Characteristics of White Polyester Film for Solar Cell>

The white polyester film for a solar cell of the present invention has whiteness of 50 or more, and preferably 60 or more. If the whiteness is less than 50, concealment properties may be inferior, it is difficult to visually check the film during processing of a solar cell module, and hence the processing efficiency may be decreased.

The white polyester film for a solar cell of the present invention has an average reflectance of 50% or more and preferably 60% or more, in the range of a wavelength of 400 to 800 nm. In addition, the average reflectance is preferably high, but the upper limit is practically 95% or so. When the reflectance is less than 50%, it is not preferred since degradation of the film itself and a member inside the solar cell due to light increases.

The acid value of the white polyester film for a solar cell of the present invention is in the range of from 1 to 50 eq/ton based on polyester. Accordingly, high hydrolysis resistance can be obtained as a member for a solar cell. The acid value is preferably 2 eq/ton or more, and more preferably 3 eq/ton or more, and preferably 40 eq/ton or less, and more preferably 30 eq/ton or less based on polyester. In view of productivity, the acid value is preferably 1 eq/ton or more. On the other hand, when the acid value is higher than 50 eq/ton, the hydrolysis resistance of the film may be lowered, and early deterioration may be happened.

The thickness of the white polyester film for a solar cell of the present invention is set to 30 to 380 μm. The thickness is preferably 35 μm or more, and more preferably 40 μm or more, and preferably 250 μm or less, and more preferably 230 μm or less. The thickness of the film is controlled to the above range, whereby the film is excellent in electric insulation and is also easy to be made lightweight and thin. On the other hand, when the thickness of the film is larger than 380 μm, it is unlikely to make the film lightweight and thin. Also, when the thickness is less than 30 μm, the film is unlikely to exhibit an electric insulation effect.

The white polyester film for a solar cell of the present invention can exhibit high hydrolysis resistance durable for the long-time use in outside. Specifically, as the evaluation index of hydrolysis resistance, the breaking elongation retention of the film after accelerated hydrolysis test (treatment at 121° C., 100% RH, 0.03 MPa, for 48 hours) can be maintained to 60% or more, preferably 70% or more, and more preferably 80% or more, and especially preferably 100% or less.

Since photolysis and degradation are suppressed even under light irradiation, the white polyester film for a solar cell of the present invention can exhibit excellent light resistance durable for the long-time use in outside. Specifically, as the evaluation index of light resistance, the breaking elongation retention of the film after accelerated photo degradation test (irradiation at 63° C., 50% RH and UV irradiation intensity of 100 mW/cm$^2$ for 100 hours) can be maintained to 35% or more, preferably 40% or more, and more preferably 60% or more. Therefore, the film of the present invention is suitable as a sealing sheet for a back surface of a solar cell used outdoors.

The change of the color b* value after the accelerated photo degradation test in the white polyester film for a solar cell of the present invention is preferably 12 or less, more preferably 10 or less, further preferably less than 5. When the change of the color b*value is larger than 12, it is not preferred since appearance deteriorates due to secular change.

The white polyester film for a solar cell of the present invention does not contain fine air bubbles, and the apparent density of the entire film is preferably 1.3 g/cm$^3$ or more, and more preferably 1.35 g/cm$^3$ or more. When the apparent density is less than 1.3 g/cm$^3$, voids are formed in the film, so that the hydrolysis resistance decreases. On the other hand, when the apparent density exceeds 1.5 g/cm$^3$, the amount of the inorganic fine particles in the film increases and the hydrolysis resistance decreases. The apparent density is preferably 1.5 g/cm$^3$ or less, and more preferably 1.45 g/cm$^3$ or less.

The thermal shrinkage rate of the white polyester film for a solar cell of the present invention at 150° C. for 30 minutes is preferably 0.2% or more, and more preferably 0.4% or more, and preferably 3.0% or less, and more preferably 1.8% or less in the longitudinal direction. Accordingly, the generation of curl in a heating process or in a layered state is suppressed. In contrast to this, in a thermal shrinkage rate of less than 0.2%, there may be the case where the film bends in processing. On the other hand, when the thermal shrinkage rate is more than 3.0%, shrinkage in processing is large, thus there may be the case where washboard-like wrinkles are generated. As a method of controlling the thermal shrinkage rate at 150° C. to be within the above range, a method where the stretching condition is controlled, a method where longitudinal relaxation treatment and transverse relaxation treatment are conducted during a heat fixing step, or the like can be given.

In the white polyester film for a solar cell of the present invention, it is preferred to keep the balance of longitudinal and transverse orientations. More specifically, the MOR value converted to the case where the film thickness is 50 μm (MOR-C) is preferably 1.0 or more and more preferably 1.3 or more, and preferably 2.0 or less and more preferably 1.8 or less. Accordingly, the balance of longitudinal and transverse orientations of the film is adjusted, and mechanical strength and durability are likely to be maintained. Also, generation of curl in laminating is suppressed, and adhesion is also improved. A method of controlling MOR-C in the above range can be carried out by controlling longitudinal and transverse stretch ratio in the stretching step of the film.

Since the white polyester film for a solar cell of the present invention is further laminated with other layers to be used as a sealing sheet for a back surface of a solar cell, it is preferred that the film surface on the side opposite to the side having the layer concentrically containing inorganic fine particles be flat and smooth. Specifically, the three-dimensional surface roughness (SRa) of the above-mentioned film surface on the opposite side is preferably is 0.1 μm or less.

As described above, the white polyester film for a solar cell of the present invention satisfies all environmental durability represented by light resistance and hydrolysis resistance, whiteness, and light reflectivity, and also exhibits excellent electric insulation, whereby integration of the conventional durable layer (hydrolysis-resisting layer), white-colored layer and insulation layer can be accomplished. Therefore, when the white polyester film for a solar cell of the present invention is used as a sealing sheet for a back surface of a solar cell, it is possible to cope with a demand for light weight and thin film.

<Sealing Sheet for Back Surface of Solar Cell>

The white polyester film for a solar cell of the present invention can be used as a base film for a sealing sheet for a back surface of a solar cell or a laminating material for flexible electronic components. The white polyester film for a solar cell of the present invention is particularly advantageous as a base film for a sealing sheet for a back surface of a solar cell where high environmental durability is demanded.

The sealing sheet for a back surface of a solar cell of the present invention is used on the surface in contact with the encapsulation resin layer of a solar cell module and/or on the outermost surface of the solar cell module to protect the solar cell module on the back side of the solar cell.

The white polyester film for a solar cell of the present invention can be used as the sealing sheet for a back surface of a solar cell either solely or by laminating two or more films. For the purpose of imparting water-vapor barrier properties, a water-vapor barrier layer such as a film having water-vapor barrier properties or an aluminum foil may be laminated on the white polyester film for a solar cell of the present invention. Examples of the lamination form of the water-vapor barrier layer include a lamination structure with an adhesive layer interposed therebetween, a direct lamination structure, a sandwich structure, and the like.

As the film having water-vapor barrier properties, there may be used polyvinylidene fluoride coated film, silicon oxide deposited film, aluminum oxide deposited film, aluminum deposited film, or the like.

<Solar Cell Module>

The solar cell module in the present invention refers to a system where incident light such as sunlight or room light is received and converted into electricity, and the electricity is stored, and comprises the sealing sheet for a back surface of a solar cell, a encapsulation resin layer adjacent to the sealing sheet for a back surface of a solar cell, and a solar cell device embedded in the encapsulation resin layer.

The resin used in the encapsulation resin layer is not particularly limited, olefin resins such as EVA and PVB can be exemplified.

Incidentally, the solar cell module of the present invention may contain a surface protecting sheet, a high transmission material for light and the like, and a material with flexible properties is also used depending on usage.

This application claims the benefit of priority to Japanese Patent Application No. 2015-057684, filed on Mar. 20, 2015. The entire contents of the specifications of Japanese Patent Application No. 2015-057684, filed on Mar. 20, 2015 are incorporated herein by reference.

EXAMPLES

Next, the present invention will be described in detail with reference to Examples and Comparative Examples, but the present invention is not limited thereto, and the variation and the modification of the present invention without departing the gist described above and below are all included the technical scope of the present invention. The measurement and evaluation methods employed in the present invention are described as follows.

<Average Particle Diameter of the Inorganic Fine Particles>

The average particle size of the inorganic fine particles was calculated by the method described above.

<Intrinsic Viscosity (IV) of Polyester>

The intrinsic viscosity was measured at 30° C. after the polyester was dissolved in mixture solvent of phenol/1,1,2,2-tetrachloroethane in mass ratio of 6/4. In case of the master batch and film containing inorganic fine particles, the intrinsic viscosity was measured after solid content was removed with centrifugation.

<Content of Diethylene Glycol (DEG)>

After 0.1 g of each polyester was heated and decomposed at 250° C. in 2 ml of methanol, quantitive analysis was carried out by gas chromatography to determine the content of diethylene glycol.

<Acid Value>

The acid value of a film or a raw material polyester resin was measured with the following method.

(1) Preparation of Sample

A film or a raw material polyester resin was crushed and vacuum-dried at 70° C. for 24 hours, and thereafter weight in a range of 0.20±0.0005 g with a balance. The mass at that time was defined as W (g). To a test tube were added 10 ml of benzyl alcohol and the weighed each sample, and the test tube was immersed in a benzyl alcohol heated to 205° C. and the sample was dissolved while being stirred with a glass rod. Samples obtained by adjusting the dissolution time to be 3 minutes, 5 minutes, and 7 minutes were denoted respectively as A, B and C. Next, new test tubes were made available and only benzyl alcohol was loaded thereto and subjected to the treatment in the same procedure and samples obtained by adjusting the dissolution time to be 3 minutes, 5 minutes, and 7 minutes were denoted respectively, as a, b, and c.

(2) Titration

Titration was carried out using a 0.04 mol/l potassium hydroxide solution (ethanol solution) with a previously known factor (NF). Phenol red was used as an indicator and the moment where the greenish yellow color was changed rose pink was defined as a finishing point and the titration amount (ml) of the potassium hydroxide solution was determined. The titration amounts of the samples A, B, and C were denoted as XA, XB, and XC (ml) and the titration amounts of the samples a, b, and c were denoted as Xa, Xb, and Xc (ml).

(3) Calculation of Acid Value

Using the titration amounts XA, XB, and XC for the respective dissolution times, the titration amount V (ml) at a dissolution time of 0 min was calculated by a least squares method. Similarly, the titration amount V0 (ml) was calculated using Xa, Xb, and Xc. Next, the acid value (eq/ton) was calculated according to the following equation.

$$\text{Acid Value (eq/ton)} = [(V-V0) \times 0.04 \times NF \times 1000]/W$$

<Apparent Density of Film>

The apparent density of the film was measured according to JIS K 7222 "Cellular plastics and rubbers—Determination of apparent density". For simplifying the expression, the unit of apparent density obtained was converted into g/cm$^3$.

<Whiteness of Film>

The whiteness of the film was measured according to JIS L 1015-1981-method B using Z-1001DP manufactured by NIPPON DENSHOKU INDUSTRIES CO., LTD.

<Average Reflectance of Film>

An integrating sphere was attached to a spectrophotometer (manufactured by SHIMADZU CORPORATION, automatic spectrophotometer "UV-3150"), and the spectral reflectance was measured by making corrections so that the reflectance of a standard white plate (a white standard plate "ZRS-99-010-W" manufactured by SphereOptics GmbH) was 100%. The spectral reflectance was measured in the range of a wavelength of 400 to 800 nm every 1 nm to obtain the mean value. The measurement was made with a non-reflecting black cardboard placed on the back side of a sample film and was made with light from the layer A side.

<Accelerated Photo Degradation Test>

In order to evaluate the light resistance, a continuous UV irradiation treatment was conducted on the side of the layer concentrically containing inorganic fine particles of the film for 100 hours at 63° C., 50% RH and irradiation intensity of 100 mW/cm$^2$ using Eye Super UV Tester (SUV-W151 manufactured by IWASAKI ELECTRIC CO., LTD.).

<Accelerated Hydrolysis Test>

In order to evaluate the hydrolysis resistance, the HAST (Highly Accelerated temperature and humidity Stress Test), which is standardized by JIS C 60068-2-66, was performed. Specifically, the sample film was cut into 70 mm×190 mm, and was placed using a jig at such distances as not to make contact with each other. Next, the treatment was performed at 121° C., 100% RH and 0.03 MPa, for 48 hours, using EHS-221 manufactured by ESPEC Corp.

<Breaking Elongation Retention>

The light resistance and hydrolysis resistance were evaluated in accordance with the breaking elongation retention. Specifically, the breaking elongation of each sample before and after the accelerated photo degradation test and the accelerated hydrolysis test described above was measured according to JIS C 2318-1997 5.3.31 (tensile strength and elongation) and the breaking elongation retention was calculated according to the following equation.

Breaking elongation retention (%)=[(breaking elongation after treatment)×100]/(breaking elongation before treatment)

The light resistance was evaluated according to the following criteria, and ○ or ⊚ was evaluated as excellent in weather resistance. As for elongation retention after accelerated photo degradation test, it was evaluated as x when the value was less than 35%, ○ when the value was 35% or more and less than 60%, and ⊚ when the value was 60% or more.

The hydrolysis resistance was evaluated according to the following criteria, and ○ or ⊚ was evaluated as excellent in hydrolysis resistance. As for elongation retention after accelerated hydrolysis test, it was evaluated as x when the value was less than 60%, ○ when the value was 60% or more and less than 80%, and ⊚ when the value was 80% or more.
<Change of Color b* Value>

The sample film was cut into 40 mm×40 mm, using a standard white plate of X=94.19, Y=92.22 and Z=110.58, by a color b* value difference meter (ZE-2000 manufactured by NIPPON DENSHOKU INDUSTRIES CO., LTD.), the color b* values of the sample film before and after the accelerated photo degradation test were measured according to JIS K 7105-1981 5.3.5(a). The change of the color b* value was obtained in accordance with the following equation.

Change of color b* value=(Color b* value after accelerated photo degradation test)−(Color b* value before accelerated photo degradation test)

In this example, when the change of the color b* value was evaluated according to the following criteria, ○ or ⊚ was evaluated as excellent in appearance. As for change of color b*, it was evaluated as x when the value was more than 12, ○ when the value was 5 or more and 12 or less, and ⊚ when the value was less than 5.

Thermal shrinkage rate of longitudinal direction at 150° C. (HS150)

A sample film was cut into 10 mm×250 mm such a direction that longer sides each coincided with the longer direction, the film was marked at an interval of 200 mm, and an interval A was measured under a fixed tension of 5 g. Subsequently, after the sample film was left standing in an oven in an atmosphere of 150° C. for 30 minutes under no-load, the sample film was taken out from the oven to cool to room temperature. Then, a marked interval B was determined under a fixed tension of 5 g, and a thermal shrinkage rate was determined by the following equation. The above thermal shrinkage rate was measured at points in which sample was divided equally among three in the sample film width direction, average values for 3 points were rounded off to the three decimal places and rounded to the second decimal place digit.

Thermal shrinkage rate (%)=[(A−B)×100]/A

<Surface Strength>

The sample film cut out into a size of 5 cm×20 cm was fully adhered onto a flat plate glass using a polyester double-sided adhesive tape A so that the side of the layer concentrically containing inorganic fine particles was laid outside. An adhesive tape B (manufactured by Nichiban Co., Ltd.; Cellotape (registered trademark)) of 24 mm width was adhered onto the surface of the sample film over a length of 35 mm followed by being allowed to stand for 1 minute. After that, the adhesive tape B was peeled off at a time in a direction vertical to the glass surface, and the surface of the side of the layer concentrically containing inorganic fine particles was observed.

As a result of observation, when the sample film surface was peeled off to an extent of 50% or more of the peeled area of the adhesive tape B, it was defined as "peeled off", when the frequency of "peeled off" was less than one half upon five or more repetitions, it was evaluated as "○" (excellent in surface strength), and when the above was one half or more, it was evaluated as "x" (inferior in surface strength).
<Transfer-Mark Concealment Properties>

The film cut out into a size of 100 mm×100 mm and the following EVA sheet cut out into a size of 70 mm×90 mm were prepared, and layered in a configuration of film/EVA sheet/glass to prepare a laminate. In the above configuration, the film was disposed such that the layer B was opposed to the EVA sheet in each Example, but only in Example 9, the film was disposed such that one surface of the layer A was opposed to the EVA sheet. Embossed sheets were put on both surfaces of the laminate thus obtained, and the laminate was heated and pressed under the conditions for preparing a sample described later to prepare a sample in which irregularities were transferred to the film.

A light source (fluorescent lamp) was placed such that the incident angle of light was 45 degrees with respect to the surface of the sample thus prepared, and the difficulty in visibility of surface irregularities was evaluated by visually observing. Evaluation criteria were as follows, and Δ or ○ was evaluated as excellent in transfer-mark concealment properties.

○: no transfer mark observed
Δ: transfer mark slightly observed
x: transfer mark clearly observed
(Conditions for Preparing Sample)

Apparatus: Vacuum laminator (manufactured by NPC Incorporated, LM-30×30 type)

Embossed sheet: Vacuum laminator accessories (manufactured by NPC Incorporated, glass cross sheet)

Pressure: 1 atmospheric pressure

EVA sheet: UltraPearl (registered trademark) PV (0.4 mm) manufactured by SANVIC INC.

Laminating step: at 100° C. (for 5 minutes in vacuo and for 5 minutes with pressure in vacuo)

Curing step: thermal treatment at 150° C. (at ordinary pressure for 45 minutes)
<Measurement of Half-Value Width of Protrusion Distribution of Layer Concentrically Containing Inorganic Fine Particles (Layer A)>

The half-value width (nm) of the protrusion distribution of layer A was measured by the method described above.
<Production of Polyester Resin Pellet>
(1) Production of PET Resin Pellet I (PET-I)

The temperature of an esterification reactor was raised, and when it reached 200° C., a slurry consisting of 86.4 parts by mass of terephthalic acid and 64.4 parts by mass of ethylene glycol was charged, and as catalysts, 0.017 parts by mass of antimony trioxide and 0.16 parts by mass of triethylamine were added thereto with stirring. Subsequently, the temperature was raised with pressure, and under the conditions of a gauge pressure of 3.5 kgf/cm² (343 kPa) and 240° C., an esterification reaction was conducted under pressure. Thereafter, the air inside of the esterification reactor was returned to atmospheric pressure, and 0.071 parts by mass of magnesium acetate tetrahydrate, then 0.014 parts by mass of trimethyl phosphate were added thereto. Furthermore, the temperature was raised up to 260° C. over 15 minutes, 0.012 parts by mass of trimethyl phosphate, then 0.0036 parts by mass of sodium acetate were added thereto. After 15 minutes, the resulting esterification reaction product was transferred to a polycondensation reactor, and the temperature was gradually raised from 260° C. to 280° C. under reduced pressure, then a polycondensation reaction was carried out at 285° C.

After completion of the polycondensation reaction, a filtration treatment was conducted using a filter made of NASLON (registered trademark) where a 95%-cut radius was 5 μm, and the filtrate was extruded from a nozzle into a strand shape and cooled and solidified using a cooling water which was previously subjected to a filtering treatment (pore size: 1 μm or less), and was cut into pellets. The intrinsic viscosity and acid value of the resulting PET resin pellet (PET-I) were 0.62 dl/g and 15.1 eq/ton, respectively, and neither inactive particles nor internally precipitated particles were substantially contained.

(2) Production of PET Resin Pellet II (PET-II)

The PET resin pellet I (PET-I) was previously subjected to preliminary crystallization at 160° C., then subjected to a solid-phase polymerization under a nitrogen atmosphere at a temperature of 220° C. to give a PET resin pellet II (PET-II) having an intrinsic viscosity of 0.71 dl/g and an acid value of 11 eq/ton.

<Production of $SiO_2$-Containing Master Batch Pellet>

(1) Production of $SiO_2$-Containing Master Batch Pellet I ($SiO_2$ MB-I)

In the production of the above-mentioned PET resin pellet I, $SiO_2$ particles having an average particle diameter of 2.7 μm (value obtained according to an electron microscopic method) were added at a ratio of 20,000 ppm relative to polyester to give a $SiO_2$-containing master batch pellet I ($SiO_2$ MB-I). This pellet I had an intrinsic viscosity of 0.62 dl/g and an acid value of 17 eq/ton.

(2) Production of $SiO_2$-Containing Master Batch Pellet II ($SiO_2$ MB-II)

The $SiO_2$-containing master batch pellet I ($SiO_2$ MB-I) obtained in the manner as mentioned above was previously subjected to preliminary crystallization at 160° C., then subjected to a solid-phase polymerization under a nitrogen atmosphere at a temperature of 220° C. to give a $SiO_2$-containing master batch pellet II ($SiO_2$ MB-II) having an intrinsic viscosity of 0.71 dl/g and an acid value of 11 eq/ton. This pellet II had an intrinsic viscosity of 0.71 dl/g and an acid value of 11 eq/ton.

(3) Production of $SiO_2$-Containing Master Batch Pellet III ($SiO_2$ MB-III)

In the production of the above-mentioned PET resin pellet I, $SiO_2$ particles having an average particle diameter of 6.5 μm (value obtained according to an electron microscopic method) were added at a ratio of 20,000 ppm relative to polyester to obtain a $SiO_2$-containing master batch pellet. The $SiO_2$-containing master batch pellet thus obtained was previously subjected to preliminary crystallization at 160° C., then subjected to a solid-phase polymerization under a nitrogen atmosphere at a temperature of 220° C. to give a $SiO_2$-containing master batch pellet III ($SiO_2$ MB-III) as shown in Table 1. This pellet III had the same intrinsic viscosity and acid value as those of the above-mentioned pellet II.

(4) Production of $SiO_2$-Containing Master Batch Pellet IV ($SiO_2$ MB-IV)

In the production of the above-mentioned PET resin pellet I, $SiO_2$ particles having an average particle diameter of 1.7 μm (value obtained according to an electron microscopic method) were added at a ratio of 20,000 ppm relative to polyester to obtain a $SiO_2$-containing master batch pellet. The $SiO_2$-containing master batch pellet thus obtained was previously subjected to preliminary crystallization at 160° C., then subjected to a solid-phase polymerization under a nitrogen atmosphere at a temperature of 220° C. to give a $SiO_2$-containing master batch pellet IV ($SiO_2$ MB-IV) as shown in Table 1. This pellet IV had the same intrinsic viscosity and acid value as those of the above-mentioned pellet II.

<Production of Titanium Oxide-Containing Master Batch Pellet>

(1) Production of Titanium Oxide Fine Particles-Containing Master Batch Pellet I ($TiO_2$ MB-I)

As raw materials, a mixture of 50% by mass of a PET resin pellet I (PET-I) previously dried at 120° C. under $10^{-3}$ torr (about 0.133 Pa) for about 8 hours with 50% by mass of rutile-type titanium dioxide having an average particle size of 0.3 μm (value obtained according to an electron microscopic method) was fed to a biaxial vent-type extruder and extruded at 275° C. with deaeration by kneading to obtain a master batch pellet I ($TiO_2$ MB-I) containing fine particles of rutile-type titanium dioxide. This pellet had an intrinsic viscosity of 0.45 dl/g and an acid value of 42.2 eq/ton.

(2) Production of Titanium Oxide Fine Particles-Containing Master Batch Pellet II ($TiO_2$ MB-II)

Solid-phase polymerization was conducted using the pellet thus obtained with a rotary vacuum polymerization reactor under a reduced pressure of 0.5 mmHg at 220° C. to obtain a master batch pellet II ($TiO_2$ MB-II) having an intrinsic viscosity of 0.71 dl/g and an acid value of 23.5 eq/ton.

<Production of Zeolite-Containing Master Batch Pellet>

As raw materials, a mixture of 90% by mass of a PET resin pellet I (PET-I) previously dried at 120° C. under $10^{-3}$ torr (about 0.133 Pa) for 8 hours with 10% by mass of zeolite having an average particle size of 2.4 μm (value obtained according to an electron microscopic method) was fed to a biaxial vent-type extruder and extruded at 275° C. with deaeration by kneading to obtain a pellet, and solid-phase polymerization was conducted using the obtained pellet with a rotary vacuum polymerization reactor under a reduced pressure of 0.5 mmHg at 220° C. to obtain a zeolite-containing master batch pellet (zeolite MB) having an intrinsic viscosity of 0.71 dl/g and an acid value of 23.5 eq/ton.

The particle diameter, intrinsic viscosity, and acid value of each of the resulting master batch pellets are shown in Table 1. In Table 1, the numerical values shown in parentheses in the row of the $TiO_2$ MB-II and the row of the $SiO_2$ MB-II indicate the concentrations of the inorganic fine particles I and the inorganic fine particles II in the layer A, respectively.

<Production of White Polyester Film for Solar Cell>

Films of the following Examples 1 to 9 and Comparative Examples 1 to 6 were produced as mentioned below. The raw material compositions of these films are together shown in Table 1.

Example 1

Raw materials of the layer concentrically containing fine particles (layer A) obtained by mixing 44% by mass of PET-II, 36% by mass of $TiO_2$ MB-II and 20% by mass of $SiO_2$ MB-II and raw materials of other layer (layer B) obtained by mixing 97% by mass of PET-II and 3% by mass of $TiO_2$ MB-II were each charged into a separate extruder, mixed and melted at 285° C., then conjugated in a melted state so as to give layer A/layer B by using a feed-block. At that time, the rate of discharge amounts for the layer A to the layer B was controlled using a gear pump. Subsequently, the resulting substance was extruded using a T-die onto a cooling drum adjusted to 30° C. to prepare a non-stretched sheet.

The resulting non-stretched sheet was uniformly heated at 75° C. using a heating roll and subjected to roll stretching (longitudinal stretching) of 3.3 times by heating at 100° C. with a non-contacting heater. The resulting uniaxially stretched film was introduced to a tenter, subjected to a transverse stretch of 4.0 times by heating at 140° C., subjected to a heating treatment at 215° C. for 5 seconds by fixing its width and further subjected to a 4% relaxation treatment at 210° C. in a width direction to obtain a white polyester film roll for a solar cell having a thickness of 50 μm.

Examples 2 to 7

The same procedure was carried out as in Example 1, except that the raw material compositions of the layer A and the layer B were changed as shown in Table 1, to obtain a white polyester film roll for a solar cell.

Example 8

The same procedure was carried out as in Example 1, except that the total thicknesses of the film was changed to 38 μm, and the raw material compositions of the layer A and the layer B were changed as shown in Table 1, to obtain a white polyester film roll for a solar cell.

Example 9

The same procedure was carried out as in Example 1, except that the layer structure was changed to a configuration in which the layer A, the layer B and the layer A are laminated in this order, and the raw material compositions of the layer A and the layer B were changed as shown in Table 1, to obtain a white polyester film roll for a solar cell.

Comparative Examples 1 to 6

The same procedure was carried out as in Example 1, except that the compositions of the layer A and the layer B were changed as shown in Table 1, to obtain a white polyester film roll for a solar cell.

Characteristics of the film obtained in Examples and Comparative Examples were shown in Table 2.

TABLE 1

| | | (before and after solid-phase polymerization) | particle diameter (μm) | amount (mass %) | intrinsic viscosity (dl/g) | acid value (eq/ton) | Example 1 | Example 2 | Example 3 | Example 4 | Example 5 |
|---|---|---|---|---|---|---|---|---|---|---|---|
| layer A | PET | PET-I (before) | — | — | 0.62 | 15.1 | | | | | |
| | | PET-II (after) | — | — | 0.71 | 11 | 44 | 24 | 44 | 24 | 40 |
| | fine particles I | TiO$_2$ MB-I (before) | 0.3 | 50 | 0.45 | 42.2 | | | | | |
| | | TiO$_2$ MB-II (after) | 0.3 | 50 | 0.71 | 23.5 | 36 (18) | 36 (18) | 36 (18) | 36 (18) | 36 (18) |
| | fine particles II | SiO$_2$ MB-IV (after) | 1.7 | 2 | 0.71 | 11 | | | | | |
| | | zeolite MB (after) | 2.4 | 10 | 0.71 | 23.5 | | | | | 4 (0.4) |
| | | SiO$_2$ MB-I (before) | 2.7 | 2 | 0.62 | 17 | | | | | |
| | | SiO$_2$ MB-II (after) | 2.7 | 2 | 0.71 | 11 | 20 (0.4) | 40 (0.8) | | | |
| | | SiO$_2$ MB-III (after) | 6.5 | 2 | 0.71 | 11 | | | 20 (0.4) | 40 (0.8) | 20 (0.4) |
| | | concentration of inorganic fine particles in layer A (mass %) | | | | | 18.4 | 18.8 | 18.4 | 18.8 | 18.8 |
| layer B | PET | PET-I before | — | — | 0.62 | 15.1 | | | | | |
| | | PET-II (after) | — | — | 0.71 | 11 | 97 | 97 | 97 | 97 | 97 |
| | fine particles | TiO$_2$ MB-I (before) | 0.3 | 50 | 0.45 | 42.2 | | | | | |
| | | TiO$_2$ MB-II (after) | 0.3 | 50 | 0.71 | 23.5 | 3 (1.5) | 3 (1.5) | 3 (1.5) | 3 (1.5) | 3 (1.5) |
| | | concentration of inorganic fine particles in layer B (mass %) | | | | | 1.5 | 1.5 | 1.5 | 1.5 | 1.5 |
| whole film | | thickness (μm) A/B | | | | | 10/40 | 10/40 | 10/40 | 10/40 | 10/40 |
| | | thickness (μm) A/B/A | | | | | | | | | |
| | | thickness ratio of layer A (%) | | | | | 20 | 20 | 20 | 20 | 20 |
| | | total thicknesses of film (μm) | | | | | 50 | 50 | 50 | 50 | 50 |
| | | total concentration of inorganic fine particles in film (mass %) | | | | | 4.88 | 4.96 | 4.88 | 4.96 | 4.96 |

| | | (before and after solid-phase polymerization) | particle diameter (μm) | amount (mass %) | intrinsic viscosity (dl/g) | acid value (eq/ton) | Example 6 | Example 7 | Example 8 | Example 9 |
|---|---|---|---|---|---|---|---|---|---|---|
| layer A | PET | PET-I (before) | — | — | 0.62 | 15.1 | | | | |
| | | PET-II (after) | — | — | 0.71 | 11 | 44 | 40 | 24 | 24 |

TABLE 1-continued

| | | (before and after solid-phase polymerization) | particle diameter (μm) | amount (mass %) | intrinsic viscosity (dl/g) | acid value (eq/ton) | | | | |
|---|---|---|---|---|---|---|---|---|---|---|
| layer A | | fine particles I | TiO₂ MB-I (before) | 0.3 | 50 | 0.45 | 42.2 | | | | |
| | | | TiO₂ MB-II (after) | 0.3 | 50 | 0.71 | 23.5 | 36 (18) | 36 (18) | 36 (18) | 36 (18) |
| | fine particles II | SiO₂ MB-IV (after) | 1.7 | 2 | 0.71 | 11 | | | | |
| | | zeolite MB (after) | 2.4 | 10 | 0.71 | 23.5 | 20 (2.0) | 4 (0.4) | | |
| | | SiO₂ MB-I (before) | 2.7 | 2 | 0.62 | 17 | | | | |
| | | SiO₂ MB-II (after) | 2.7 | 2 | 0.71 | 11 | | 20 (0.4) | 40 (0.8) | 40 (0.8) |
| | | SiO₂ MB-III (after) | 6.5 | 2 | 0.71 | 11 | | 20 | 40 | 20 |
| | | concentration of inorganic fine particles in layer A (mass %) | | | | | 20.0 | 18.8 | 18.8 | 18.8 |
| layer B | PET | PET-I (before) | — | — | 0.62 | 15.1 | | | | |
| | | PET-II (after) | — | — | 0.71 | 11 | 97 | 97 | 97 | 97 |
| | fine particles | TiO₂ MB-I (before) | 0.3 | 50 | 0.45 | 42.2 | | | | |
| | | TiO₂ MB-II (after) | 0.3 | 50 | 0.71 | 23.5 | 3 (1.5) | 3 (1.5) | 3 (1.5) | 3 (1.5) |
| | | concentration of inorganic fine particles in layer B (mass %) | | | | | 1.5 | 1.5 | 1.5 | 1.5 |
| whole film | | thickness (μm) A/B | | | | | 10/40 | 10/40 | 8/30 | |
| | | thickness (μm) A/B/A | | | | | | | | 5/40/5 |
| | | thickness ratio of layer A (%) | | | | | 20 | 20 | 20 | 20 |
| | | total thicknesses of film (μm) | | | | | 50 | 50 | 38 | 50 |
| | | total concentration of inorganic fine particles in film (mass %) | | | | | 5.20 | 4.96 | 4.96 | 4.96 |

| | | (before and after solid-phase polymerization) | particle diameter (μm) | amount (mass %) | intrinsic viscosity (dl/g) | acid value (eq/ton) | Comparative Example 1 | Comparative Example 2 | Comparative Example 3 | Comparative Example 4 | Comparative Example 5 | Comparative Example 6 |
|---|---|---|---|---|---|---|---|---|---|---|---|---|
| layer A | PET | PET-I (before) | — | — | 0.62 | 15.1 | | | | | 24 | |
| | | PET-II (after) | — | — | 0.71 | 11 | 24 | 64 | 60 | 92 | | 34 |
| | fine particles I | TiO₂ MB-I (before) | 0.3 | 50 | 0.45 | 42.2 | | | | | 36 (18) | |
| | | TiO₂ MB-II (after) | 0.3 | 50 | 0.71 | 23.5 | 36 (18) | 36 (18) | | | | 36 (18) |
| | fine particles II | SiO₂ MB-IV (after) | 1.7 | 2 | 0.71 | 11 | 40 (0.8) | | | | | |
| | | zeolite MB (after) | 2.4 | 10 | 0.71 | 23.5 | | | | 8 (0.8) | | 30 (3.0) |
| | | SiO₂ MB-I (before) | 2.7 | 2 | 0.62 | 17 | | | | 40 (0.8) | | |
| | | SiO₂ MB-II (after) | 2.7 | 2 | 0.71 | 11 | | | | | | |
| | | SiO₂ MB-III (after) | 6.5 | 2 | 0.71 | 11 | | | 40 (0.8) | | | |
| | | concentration of inorganic fine particles in layer A (mass %) | | | | | 18.8 | 18.0 | 0.8 | 0.8 | 18.8 | 21.0 |
| layer B | PET | PET-I (before) | — | — | 0.62 | 15.1 | | | | | 97 | |
| | | PET-II (after) | — | — | 0.71 | 11 | 97 | 97 | 97 | 97 | | 97 |
| | fine particles | TiO₂ MB-I (before) | 0.3 | 50 | 0.45 | 42.2 | | | | | 3 (1.5) | |
| | | TiO₂ MB-II (after) | 0.3 | 50 | 0.71 | 23.5 | 3 (1.5) | 3 (1.5) | 3 (1.5) | 3 (1.5) | | 3 (1.5) |
| | | concentration of inorganic fine particles in layer B (mass %) | | | | | 1.5 | 1.5 | 1.5 | 1.5 | 1.5 | 1.5 |
| whole film | | thickness (μm) A/B | | | | | 10/40 | 10/40 | 10/40 | 10/40 | 10/40 | 10/40 |
| | | thickness (μm) A/B/A | | | | | | | | | | |
| | | thickness ratio of layer A (%) | | | | | 20 | 20 | 20 | 20 | 20 | 20 |
| | | total thicknesses of film (μm) | | | | | 50 | 50 | 50 | 50 | 50 | 50 |
| | | total concentration of inorganic fine particles in film (mass %) | | | | | 4.96 | 4.80 | 1.36 | 1.36 | 4.96 | 5.01 |

TABLE 2A

| Evaluation | Example 1 | Example2 | Example3 | Example4 | Example5 | Example6 | Example7 | Example8 | Example9 |
|---|---|---|---|---|---|---|---|---|---|
| Transfer-Mark Concealment Properties | Δ | ○ | ○ | ○ | ○ | ○ | ○ | ○ | ○ |
| half-value width (nm) | 228 | 361 | 405 | 817 | 920 | 789 | 727 | 380 | 383 |

TABLE 2A-continued

| | | | | | | | | | |
|---|---|---|---|---|---|---|---|---|---|
| intrinsic viscosity (dl/g) | 0.69 | 0.69 | 0.69 | 0.69 | 0.67 | 0.68 | 0.67 | 0.68 | 0.69 |
| Content of DEG (mol %) | 1.5 | 1.6 | 1.6 | 1.6 | 1.5 | 1.5 | 1.5 | 1.6 | 1.6 |
| Acid Value (eq/ton) | 18 | 18 | 18 | 18 | 18 | 18 | 18 | 18 | 18 |
| Apparent Density (g/cm³) | 1.4 | 1.4 | 1.4 | 1.4 | 1.4 | 1.4 | 1.4 | 1.4 | 1.4 |
| Whiteness | 94 | 94 | 94 | 94 | 94 | 94 | 94 | 94 | 94 |
| Average Reflectance (%) | 75 | 72 | 74 | 71 | 75 | 74 | 75 | 78 | 70 |
| Breaking elongation retention of after accelerated hydrolysis (%) | ◎ | ◎ | ◎ | ◎ | ◎ | ◎ | ◎ | ◎ | ◎ |
| Breaking elongation retention after accelerated photo degradation (%) | ◎ | ◎ | ◎ | ◎ | ◎ | ◎ | ◎ | ◎ | ◎ |
| Change of Color b* Value | ◎ | ◎ | ◎ | ◎ | ◎ | ◎ | ◎ | ◎ | ◎ |
| HS150(%) | 2.3 | 2.0 | 2.0 | 1.8 | 1.9 | 1.8 | 1.9 | 2.0 | 2.0 |
| Surface Strength | ○ | ○ | ○ | ○ | ○ | ○ | ○ | ○ | ○ |

| Evaluation | Comparative Example1 | Comparative Example2 | Comparative Example3 | Comparative Example4 | Comparative Example5 | Comparative Example6 |
|---|---|---|---|---|---|---|
| Transfer-Mark Concealment Properties | X | X | X | X | ○ | ○ |
| half-value width (nm) | 155 | 97 | 165 | 169 | 369 | 1140 |
| intrinsic viscosity (dl/g) | 0.69 | 0.68 | 0.68 | 0.68 | 0.48 | 0.68 |
| Content of DEG (mol %) | 1.6 | 1.6 | 1.6 | 1.5 | 1.6 | 1.6 |
| Acid Value (eq/ton) | 18 | 18 | 18 | 18 | 52 | 18 |
| Apparent Density (g/cm³) | 1.4 | 1.4 | 1.4 | 1.4 | 1.4 | 1.4 |
| Whiteness | 94 | 94 | 44 | 45 | 94 | 95 |
| Average Reflectance (%) | 75 | 74 | 33 | 35 | 77 | 76 |
| Breaking elongation retention of after accelerated hydrolysis (%) | ◎ | ◎ | ◎ | ◎ | X | ◎ |
| Breaking elongation retention after accelerated photo degradation (%) | ◎ | ◎ | X | X | X | ◎ |
| Change of Color b* Value | ◎ | ◎ | X | X | ○ | ◎ |
| HS150(%) | 2.2 | 2.1 | 2.2 | 2.0 | 2.0 | 2.0 |
| Surface Strength | ○ | ○ | ○ | ○ | ○ | X |

INDUSTRIAL APPLICABILITY

The white polyester film for a solar cell of the present invention has good whiteness, light reflectivity and environmental durability and moreover has excellent transfer-mark concealment properties. By using the white polyester film for a solar cell of the present invention, a sealing sheet for a back surface of a solar cell and a solar cell module that are excellent in excellent environmental durability, inexpensive, and light in weight can be provided.

The invention claimed is:

1. A white polyester film for a solar cell, wherein the film has whiteness of 50 or more, an average reflectance of 50 to 95% in a range of wavelength of 400 to 800 nm, an acid value of 1 to 50 eq/ton, and a thickness of 30 to 380 μm, wherein
the film has a multilayer structure in which a polyester resin layer is disposed as at least one outermost layer,
the polyester resin layer comprises
(i) inorganic fine particles I comprising titanium dioxide mainly composed of a rutile type, having an average particle diameter of 0.2 μm to 0.5 μm, and in an amount of 17 to 19% by mass relative to the polyester resin layer,
and
(ii) inorganic fine particles II comprising silica or zeolite, having an average particle diameter of 2.2 μm to 7.0 μm, and in an amount of 0.3 to 2.2% by mass relative to the polyester resin layer,
the inorganic fine particles I and the inorganic fine particles II are the only inorganic fine particles in the polyester resin layer,
a difference in average particle diameter between the inorganic fine particles I and inorganic fine particles II is 1.7 μm to 6.4 μm,
the polyester resin layer has a larger thickness than the average particle diameter of the inorganic fine particles II, and a half-value width of protrusion distribution on a surface of the polyester resin layer is 200 to 1000 nm, the protrusion distribution being obtained by plotting the number density of protrusions with respect to protrusion height.

2. The white polyester film for a solar cell according to claim 1, wherein the polyester resin layer does not contain barium sulfate.

3. A sealing sheet for a back surface of a solar cell using the white polyester film for a solar cell according to claim 2.

4. A solar cell module comprising the sealing sheet for a back surface of a solar cell according to claim 3, an encapsulation resin layer adjacent to the sealing sheet for a back surface of a solar cell, and a solar cell device embedded in the encapsulation resin layer.

5. A sealing sheet for a back surface of a solar cell using the white polyester film for a solar cell according to claim 1.

6. A solar cell module comprising the sealing sheet for a back surface of a solar cell according to claim 5, an encapsulation resin layer adjacent to the sealing sheet for a back surface of a solar cell, and a solar cell device embedded in the encapsulation resin layer.

* * * * *